(12) United States Patent
Shinogi et al.

(10) Patent No.: US 6,656,758 B1
(45) Date of Patent: Dec. 2, 2003

(54) METHOD OF MANUFACTURING A CHIP SIZE PACKAGE

(75) Inventors: Hiroyuki Shinogi, Gunma (JP); Ryoji Tokushige, Gunma (JP); Nobuyuki Takai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/684,604

(22) Filed: Oct. 6, 2000

(30) Foreign Application Priority Data

Oct. 13, 1999 (JP) ......................................... P.11-291471

(51) Int. Cl.$^7$ .............................................. H01L 21/00
(52) U.S. Cl. .......................... 438/33; 438/113; 438/460
(58) Field of Search .................................. 438/618, 637, 438/627, 643, 33, 461–5, 108, 113, 613, 797, 460

(56) References Cited

U.S. PATENT DOCUMENTS 6,107,164 A * 8/2000 Ohuchi ....................... 438/465
6,211,070 B1 * 4/2001 Iwasaki et al.

FOREIGN PATENT DOCUMENTS

JP          HEI-46301          11/2002

OTHER PUBLICATIONS

*Nikkei Microdevices*; pp. 44 to 71 (1998).
Japanese Office Action dated May 6, 2003.

* cited by examiner

*Primary Examiner*—W. David Coleman
(74) *Attorney, Agent, or Firm*—Fish & Richardson P.C.

(57) ABSTRACT

First, a passivation film 3 having an opening K from which a part of the Al electrode 1 formed through an interlayer insulating film 2 made of a BPSG film is exposed is formed on a wafer. A wiring layer 7, which is connected to the Al electrode 1 exposed from the opening K and extended to the upper surface of the wafer, is formed. After a metal post 8 is formed on the wiring layer 7, a first groove TC1, which is located on the periphery of the chip inclusive of the wiring layer 7 and half cuts the wafer, is formed. The upper portion of the interlayer insulating film 2 is isotropically etched through the first groove TC1 to form a second groove TC2 having a larger opening diameter than that of the first groove TC1. The wafer surface inclusive of the wiring layer 7, second groove TC2 and first groove TC1 is resin-sealed to form an insulating resin layer R. Thereafter, a solder ball 12 is formed on the metal post 8 exposed from the insulating resin layer R. Finally, the wafer is fully cut through the insulating resin layer R formed in the first and the second grooves TC1 and TC2.

15 Claims, 5 Drawing Sheets

METHOD OF MANUFACTURING A CHIP SIZE PACKAGE

BACKGROUND OF THE INVENTION

1. Field of the Invention

The present invention relates to a semiconductor device and a method of manufacturing it, and more particularly to a method for manufacturing a chip size package. The chip size package (CSP) generally refers to a package which has a size approximately equal to or slightly larger than a chip size, and intends high-density mounting on the printed(/circuit) board. The present invention relates to technology for improving reliability of the formation of a metal post adopted for the CSP.

2. Description of the Related Art

In this technical field, previously known are a structure called "BGA (Ball Grid Array)" having a plurality of solder balls arranged in a plane, a structure called "fine pitch BGA" in which the ball pitch of the BGA is further decreased to reduce the external shape to a chip size, etc.

In recent years, a wafer CSP has been proposed in "NIKKEI MICRODEVICE" August, 1998, pp 44–71. This wafer CSP is a CSP in which wirings and pads in an array are basically formed in a wafer process (pre-step) before chip dicing. Chip dicing is a step of dividing a plurality of chips by cutting the wafer. This technique is expected that it can integrate the wafer process and package process (post-step) to reduce package cost greatly.

The wafer CSP is classified into a resin-sealing type and a rearrangement wiring type (hereinafter referred to as rewiring type). The resin sealing type has a structure with the surface covered with sealing resin like a conventional package, in which metal posts are formed on a wiring layer on the chip surface and the periphery thereof is sealed with sealing resin.

Generally, it is said that when a package is loaded on a printed board, the stress generated owing to a difference in their thermal expansion coefficient therebetween is concentrated to the metal posts, but the resin sealing type, which has the metal posts with an increased length, can disperse the stress.

On the other hand, the rewiring type has a structure in which rewiring is made without using sealing resin as shown in FIG. 10. Specifically, an Al electrode 52, a wiring layer 53 and an insulating layer 54 are stacked on the surface of a chip, and a metal post 55 is formed on the wiring layer 53. A solder ball 56 is formed on the metal post 55. The wiring layer 53 is used as a rewiring for arranging the solder ball 56 in a prescribed array on the chip.

The resin sealing type in which the metal post with a length increased to about 100 μm is reinforced by sealing resin can acquire great reliability. However, the process of forming sealing resin must be carried out using a mold in a post-step. This complicates the manufacturing process.

On the other hand, the rewiring type has an advantage that the manufacturing process is relatively simple and most steps thereof can be performed in a wafer process. However, it is required to relax the stress by any technique to enhance the reliability.

Where an Al electrode is used, an opening from which the Al electrode 52 exposed is made and at least one layer of barrier metal (not shown) is formed in the opening between the metal post 55 and Al electrode 52, and the solder ball 56 is formed on the metal post 55.

The above prior art of the rewiring type has the following defects.

In the manufacturing process as seen from FIG. 10, polyimide resin is applied to cover the metal post 55 completely, and after having been hardened, its upper surface is ground to expose the head of the metal post 55. Further, after the solder ball 56 is formed on the exposed area, the wafer is diced together with the polyimide resin so that it is divided into individual chips.

Therefore, on the side exposed by dicing, an interface between the insulating layer 51 (e.g. BPSG film) formed below the Al electrode 52 and the insulating resin layer 54 is located. Since the insulating layer has high moisture absorbency, moisture invades from the interface, thus leading deterioration of the resultant element.

Further, there is a difference in the thermal expansion coefficient between the insulating resin layer of e.g. epoxy, and the BPSG film 51, between the insulating layer and an $Si_3N_4$ film, between the insulating layer and a $SiO_2$ film, etc. Therefore, when moisture invades the interface, inconvenience such as exfoliation of the insulating resin layer 54 occurred.

SUMMARY OF THE INVENTION

The present invention has been accomplished in order to overcome the inconveniences described above.

An object of the present invention is to prevent deterioration of an element when moisture invades an interface owing to a difference in the thermal expansion coefficient between the insulating resin layer of e.g. epoxy, and the BPSG film 51, between the insulating layer and an $Si_3N_4$ film, between the insulating layer and a $SiO_2$ film, etc.

In order to attain the above object, the semiconductor device according to the invention is manufactured as follows. First, as seen from FIG. 2, a passivation film 3 having an opening K from which a part of an Al electrode 1 formed through an interlayer insulating film 2 made of a BPSG film is exposed is formed on a wafer. As seen from FIG. 4, a wiring layer 7, which is connected to the Al electrode 1 exposed from the opening K and extended to the upper surface of the wafer, is formed. As seen from FIG. 5, after the metal post 8 is formed on the wiring layer 7, the first groove TC1, which is located on the periphery of a chip inclusive of the wiring layer 7 and half cuts the wafer, is formed. Further, as seen from FIG. 7, the upper portion of the interlayer insulating film 2 is isotropically etched through a first groove TC1 to form the second groove TC2 having a larger opening diameter than that of the first groove TC1. As seen from FIG. 8, the wafer surface inclusive of the wiring layer 7, second groove TC2 and first groove TC1 is resin-sealed to form the insulating resin layer R. Thereafter, as seen from FIG. 9, the solder ball 12 is formed on the metal post 8 exposed from the insulating resin layer R. Finally, the wafer is fully cut through the insulating resin layer R formed in the first and the second grooves TC1 and TC2.

The above and other objects and features of the present invention will be more apparent from the following description taken in conjunction with the accompanying drawings.

DESCRIPTION OF THE PREFERRED EMBODIMENTS

Figure 1:
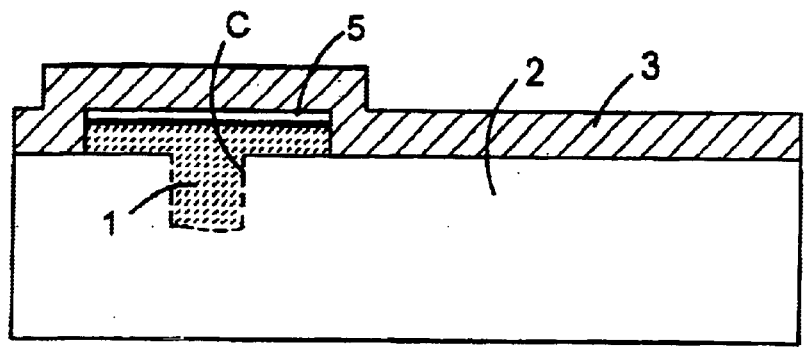
FIGS. 1 to 9 are sectional views for explaining a method for manufacturing a semiconductor device according to an embodiment of the present invention.

Now referring to the drawings, an explanation will be given of a method for manufacturing a semiconductor device according to an embodiment of the invention.

As seen from FIGS. 1 to 9 which show respective steps of the manufacturing process, in this method, after a passivation film 3 having an opening K from which a part of the Al electrode 1 formed through an interlayer insulating film 2 of the BPSG film is exposed is formed on the wafer, a metal post 8 is formed on a wiring layer 7. Thereafter, a first groove TC1 which is located on the periphery of a chip and half-cuts the wafer is formed, and the upper portion of the interlayer insulating film 2 is etched isotropically to form a second groove TC2 having a larger diameter than that of the first groove TC1. In this state, the wafer surface inclusive of the wiring layer 7, second layer TC2 and first groove TC1 and an side with unevenness is resin-sealed to form an insulating resin layer R so that the contact between the insulating resin layer and wafer is increased because of the presence of the unevenness. Further, the solder ball 12 is formed on the exposed metal post 8. Finally, the wafer is fully cut through the insulating resin layer R formed in the first and the second grooves TC1 and TC2.

Figure 2:
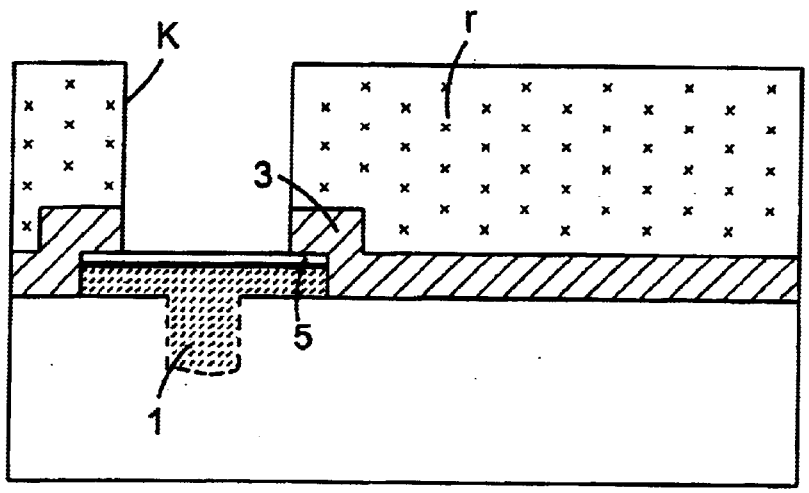

Specifically, as seen from FIG. 2, a passivation film 3 having an opening K from which a part of the Al electrode 1 formed through an interlayer insulating film 2 of the BPSG film is exposed is formed on the wafer. The wiring layer 7, which is connected to the Al electrode 1 exposed from the opening K and extended to the upper surface of the wafer, is formed.

Figure 5:
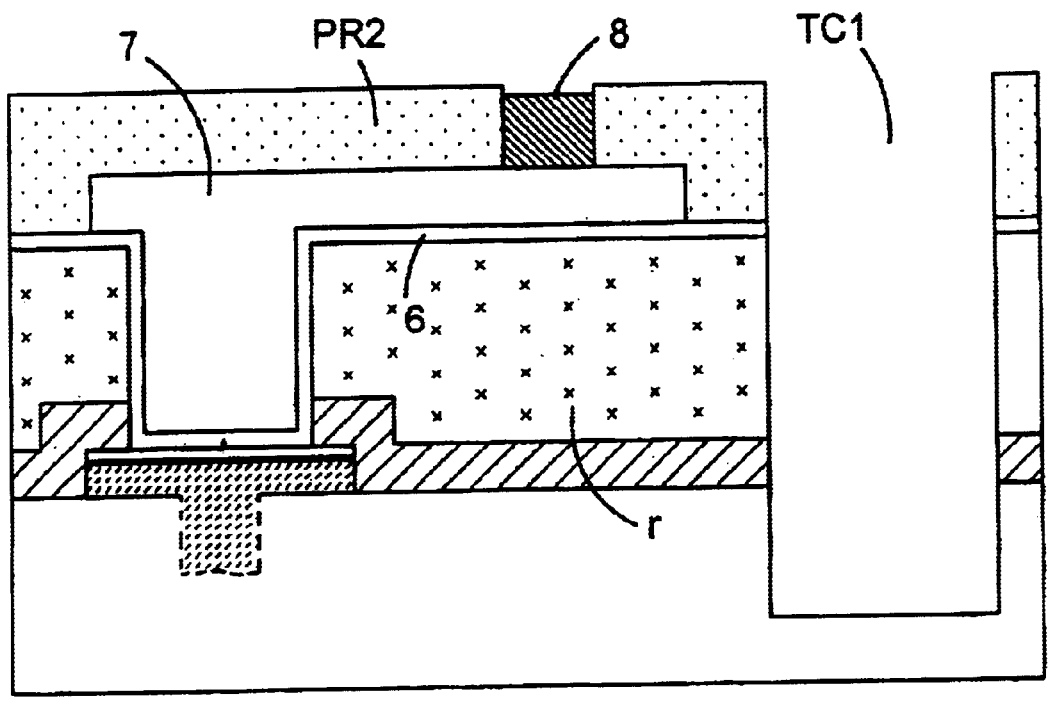

As seen from FIG. 5, after the metal post 8 is formed on the wiring layer 7, the first groove TC1, which is located on the periphery of the chip inclusive of the wiring layer 7 and half cuts the wafer, is formed.

Figure 7:
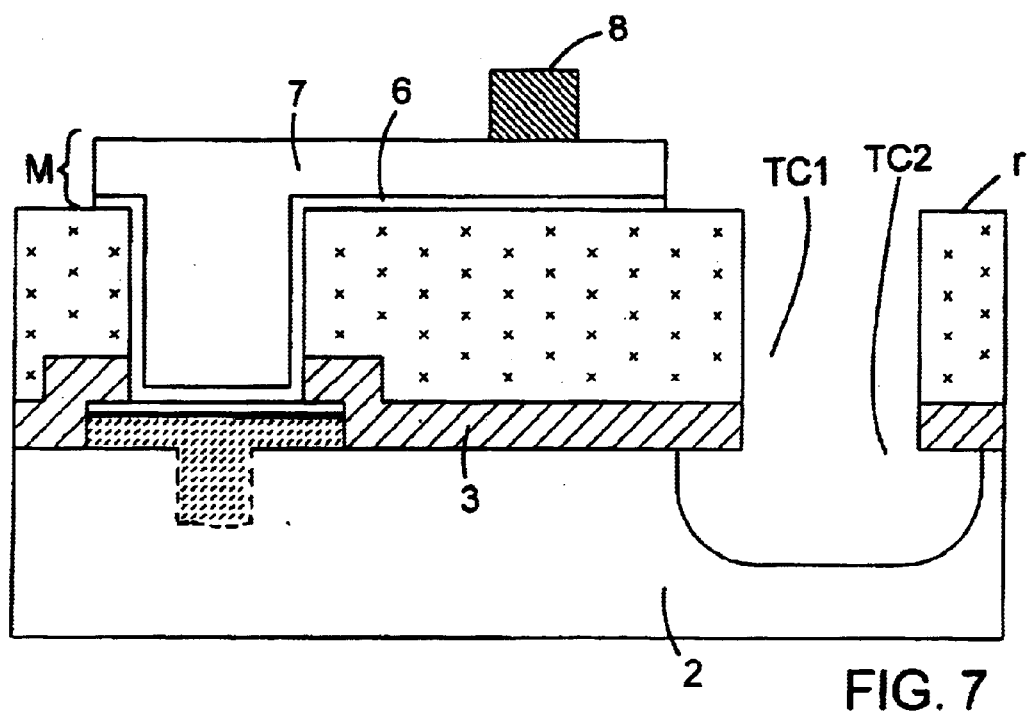

Further, as seen from FIG. 7, the upper portion of the interlayer insulating film 2 is isotropically etched through the first groove TC1 to form the second groove TC2 having a larger opening diameter than that of the first groove TC1.

Figure 8:
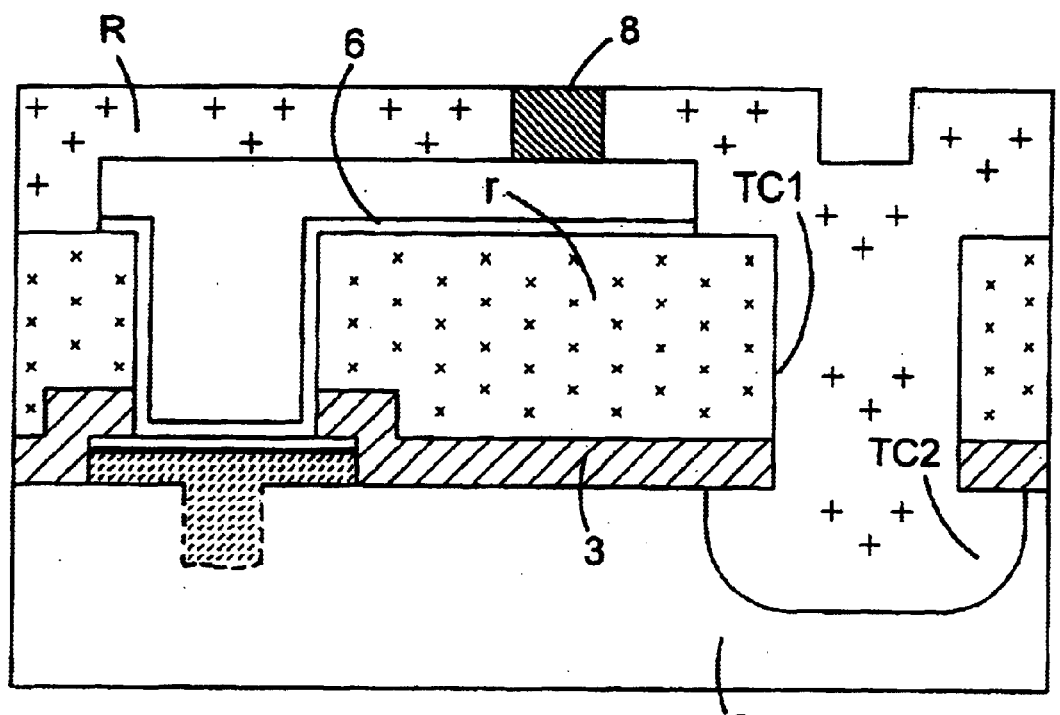

As seen from FIG. 8, the wafer surface inclusive of the wiring layer 7, second groove TC2 and first groove TC1 is resin-sealed to form the insulating resin layer R. Thereafter, as seen from FIG. 9, the solder ball 12 is formed on the metal post 8 exposed from the insulating resin layer R. Finally, the wafer is fully cut through the insulating resin layer R formed in the first and the second grooves TC1 and TC2.

Figure 9:
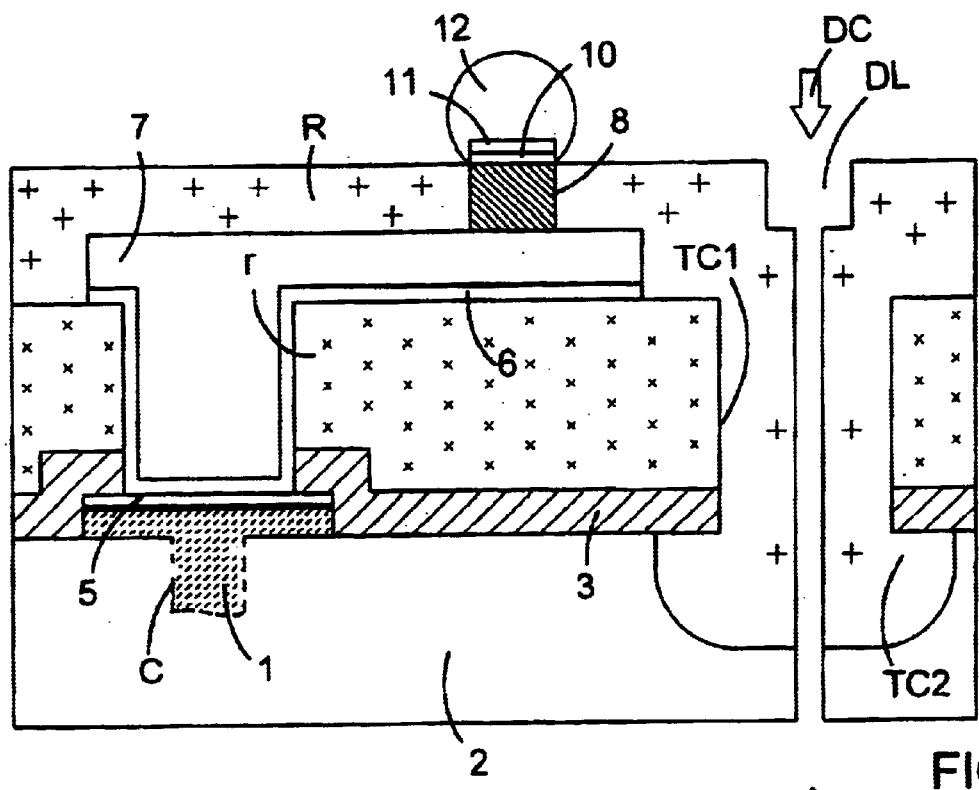
Figure 10:
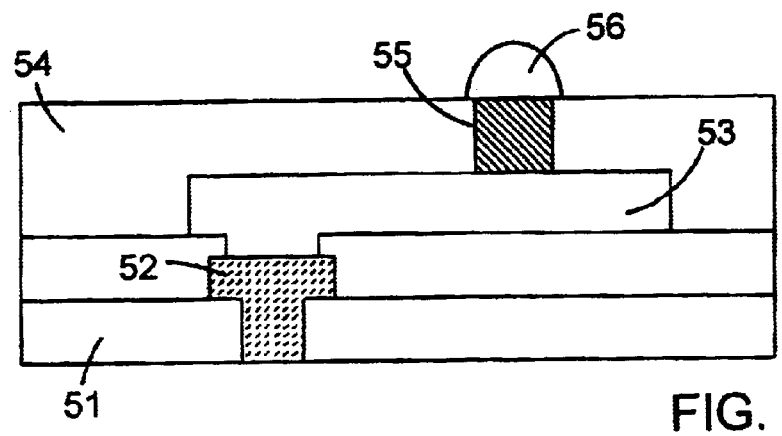
FIG. 10 is a sectional view of a conventional chip size package.

In FIG. 9, reference numeral 1 denotes an uppermost metal (serving as a bonding pad) in an IC chip of a general wire bonding type, and reference numeral 2 denotes an interlayer insulating film (e.g. BPSG film) in which a contact hole C for the Al electrode 1 is formed.

In the lower portion of the contact hole C, a plurality of metal layers are formed which are kept in contact with a diffused region, poly-Si gate, poly-Si, etc. of a transistor (MOS type of transistor or BIP type of transistor).

Although this embodiment will be explained in connection with the MOS type transistor, it is needless to say that the present invention can be applied to the BIP type transistor.

The structure according to this embodiment is applicable to an IC generally called the single metal layer, double metal layer, . . . multi-layered metal layer, and so on.

Reference numeral 3 denotes a passivation film 3. The passivation film 3 is made of silicon nitride film (hereinafter referred to as $Si_3N_4$ film) (epoxy resin or polyimide resin can be adopted). The passivation layer is covered with an insulating layer r of e.g. epoxy resin. The insulating resin layer r, as described later, realize surface flatness to make uniform the height of the solder ball.

A Ti nitride (TiN) film 5 serving as a cap metal is formed on the Al electrode 1.

An opening K from which the Ti nitride (TiN) film 5 is exposed is formed in the passivation film 3 and insulating resin layer r. A Cu thin film layer 6 which serves a plating electrode (seed layer) for a wiring layer is formed on the entire surface inclusive of the opening. The wiring layer 7 is formed by Cu plating.

An insulating resin layer R is formed on the entire chip surface inclusive of the wiring layer 7. Although not shown, in order to prevent the reaction between the resin layer R and Cu, as described later, an $Si_3N_4$ film may be formed between the interface between the resin layer R and wiring layer 7 and between the insulating resin layer R and the metal post 8.

The insulating resin layer R may be made of any resin as long as it is thermosetting resin or thermoplastic resin. Particularly, the thermosetting resin may be preferably amic acid film, polyimide, or epoxy resin. The thermoplastic resin may be preferably thermoplastic polymer ("HIMAL" available from HITACHI KASEI Co. Ltd). The amic acid film has a contraction ratio of 30–50%.

The insulating resin layer R is formed by spinning the material mainly containing liquid amic acid on the entire wafer surface so as to have a thickness of about 20–60 $\mu m$. The resin layer R is thereafter polymerized by thermosetting reaction at a temperature not lower than 300° C. However, the resin containing the amic acid before thermosetting is very active at the above temperature so that it reacts with Cu, thus deteriorating the interface. However, the provision of the $Si_3N_4$ film on the surface of the wiring layer prevents the resin layer from reacting with Cu. The $Si_3N_4$ film has a thickness of about 100–300 nm.

The $Si_3N_4$ film has excellent in barrier property whereas an $SiO_2$ film is inferior in the barrier property. Therefore, if the $SiO_2$ film is adopted, it must be formed to have a larger thickness than the $Si_3N_4$ film. Further, the $Si_3N_4$ film, which can be formed by plasma CVD, can have excellent step coverage. Further, since the insulating resin layer R is provided after the metal post 8 has been formed, the provision of the $Si_3N_4$ film prevents the reaction between the wiring layer 7 made of Cu and the insulating resin layer mainly containing the amic acid and between the metal post made of Cu and the insulating resin layer R mainly containing the amic acid.

If the solder ball is formed directly on the metal post made of Cu, the connecting strength therebetween will be deteriorated owing to oxidation of Cu. If Au is directly is formed directly on the Cu metal post in order to prevent the oxidation of Cu, Au will disperse. For this reason, Ni is interposed between the metal post of Cu and Au. The Ni layer prevents the oxidation of Cu, and the Au layer prevents the oxidation of Ni. Thus, the deterioration of the solder ball and connecting strength will be suppressed.

Although both Ni layer and Au layer are formed by electrolytic plating, they can be formed by non-electrolytic plating.

Finally, the solder ball 12 is formed on the head of the metal post 8.

An explanation will be given of a difference between the solder ball and solder bump. The solder ball is prepared separately as a ball-shaped solder and fixed on the metal post. On the other hand, the solder bump is formed by the electrolytic plating by way of the wiring layer 7 and metal post 8. Namely, the solder bump is first formed as a film having a certain thickness and formed into a ball by the heat treatment in the post step.

Figure 6:
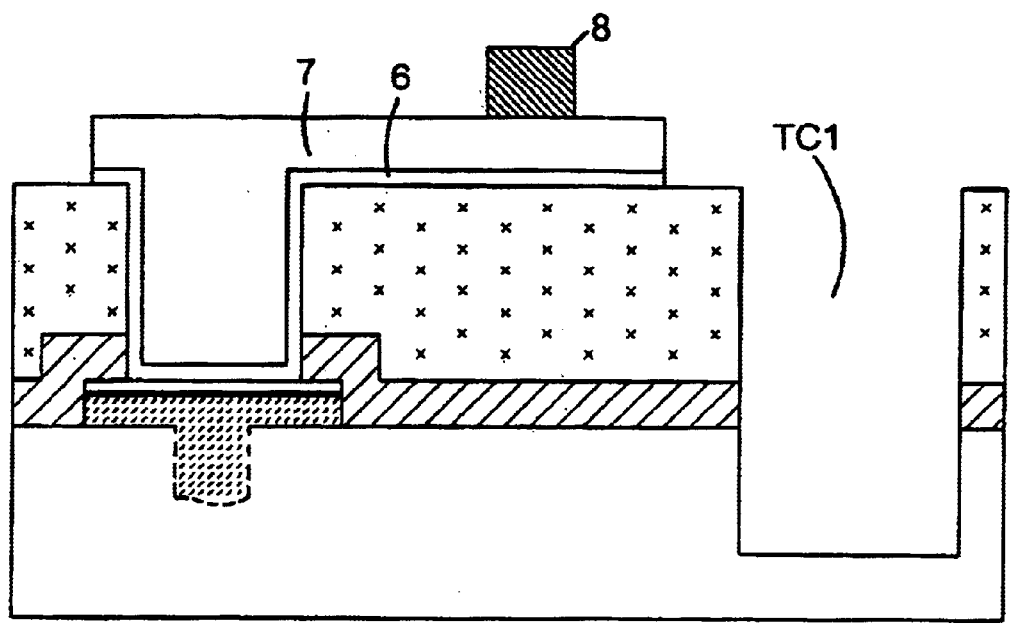

In this embodiment, as seen from FIG. 6, since the seed layer 6 has been removed, the solder bump cannot be formed by electrolytic plating. Instead of this, the solder ball is actually prepared.

The first and second grooves TC1 and TC2 are formed on the periphery of the individual chip prepared in the state of wafer. These grooves are filled with the insulating resin layer. In order to simplify the manufacturing process, the same resin layer R is used, but individual resin layers may be used aside of the simplicity of the manufacturing process.

The present invention is characterized by these grooves TC1 and TC2 and resin layer R. Specifically, the second groove TC2 having a larger opening diameter than that of the first groove TC1 is formed, and the resin layer R is embedded in these grooves TC1 and TC2. Therefore, the wafer is fully cut using a dicing blade Dc having a narrow width. Since the second groove TC2 having a larger opening diameter is provided at the approximate center position of a full cut line DL, exfoliation of the resin layer R can be suppressed. In addition, since the resin layer R is arranged between the first groove TC1 reaching at least the semiconductor substrate (Si substrate) and the full cut line DL, it can cover the interface ends of the respective layers which will be deteriorated owing to moisture, thereby preventing the deterioration of the element.

Generally, the wafer has a thickness of 200–300 μm. Further, as described above, the first groove TC1 has only to reach the semiconductor substrate (Si substrate) from the substrate surface as shown in FIG. 8, and in view of the thickness of the wafer, the depth of the groove is preferably about 1–100 μm.

An explanation will be given of a method for manufacturing the structure shown in FIG. 9.

First, a semiconductor substrate (wafer) with an LSI having an Al electrode 1 formed is prepared. The LSI is an IC composed of a single layer metal, a double layer metal, multi-layer metal as described above. For example, a source electrode and drain electrode of a transistor are formed as the first layer metal and the Al electrode 1 in contact with the drain electrode is formed as the second layer metal.

After a contact hole C from which the drain electrode is exposed is made in an interlayer insulating film 2, the entire surface of the wafer is covered with an electrode material made of mainly Al and a Ti nitride film 5. Using a photoresist layer as a mask, the Al electrode 1 and Ti nitride film 5 are dry-etched in a prescribed shape.

Unlike the case where a barrier metal is formed in the contact hole C made after a passivation film 3 is formed, the Al electrode inclusive of the Ti nitride film serving as the barrier metal can be formed using the photoresist layer. This reduces the number of manufacturing steps.

The Ti nitride film 5 serves as the barrier metal for a Cu thin film layer 6 to be formed later. In addition, the Ti nitride film 5 is efficiently used as an anti-reflective film. Namely, the Ti nitride film 5 is also efficient to prevent halation of the resist used for patterning. For the purpose of preventing the halation, the Ti nitride film 5 must have a thickness of at least 120 nm–130 nm. Further, the Ti nitride film 5 has a thickness of preferably 200 nm–300 nm in order to have a function of the barrier metal. The Ti nitride film 5 having a thickness exceeding this thickness leads to occurrence of stress.

After the Al electrode 1 and Ti nitride film 5 are formed, the entire surface of the wafer is covered with the passivation film 3. In this embodiment, the passivation film 3 is made of $Si_3N_4$, but may be made of polyimide resin (see FIG. 1 hitherto).

Next, the surface of the passivation film 3 is covered with an insulating resin layer r. The insulating resin layer r is made of a positive-type photosensitive polyimide film and has a thickness of about 3–5 μm. An opening K is made in the passivation film 3 and insulating resin layer r.

Provision of the photosensitive polyimide film 3 makes it unnecessary to use an individual photoresist layer to pattern the opening K and provision of the metal mask simplifies the manufacturing process. It is needless to say that the individual photoresist layer may be used. The polyimide layer is also used for the purpose of flattening. Specifically, in order that the height of a solder ball 12 is uniform in all the regions, the height of the metal post 8 must be also uniform, and the wiring layer 7 must be formed flat with great accuracy. Since the polyimide resin has fluidity with a certain viscosity, its application realizes flatness of the resultant surface.

The Al electrode 1 also serves as a pad for external connection of the LSI and as a wire bonding pad when a chip size package having the solder ball (solder bump) is formed (see FIG. 2 hitherto).

The entire surface is covered with the Cu thin film layer 6. This Cu thin film layer 6 constitutes a plating electrode for a wiring layer 7 (FIG. 3), and is formed by e.g. sputtering to have a thickness of about 100–200 nm.

Figure 3:
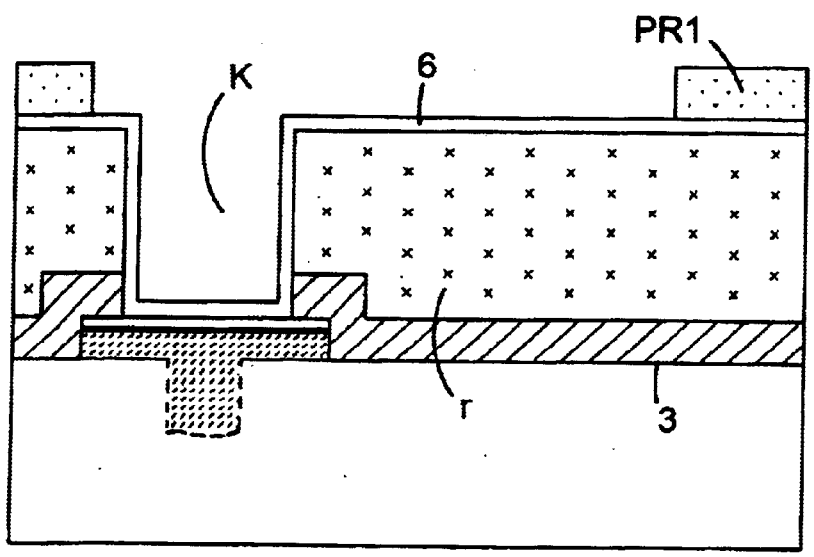

A photoresist layer PR1 is applied on the entire surface and the portion thereof corresponding to the wiring layer 7 (see FIG. 3 hitherto).

The wiring layer is formed using the Cu thin film layer 6 exposed in the opening of the photoresist layer PR1 as a plating electrode. This wiring layer 7 should have a relatively great thickness of about 2–5 μm in order to assure the mechanical strength. The wiring layer may be formed by vacuum evaporation, sputtering, etc. instead of electrolytic plating.

Figure 4:
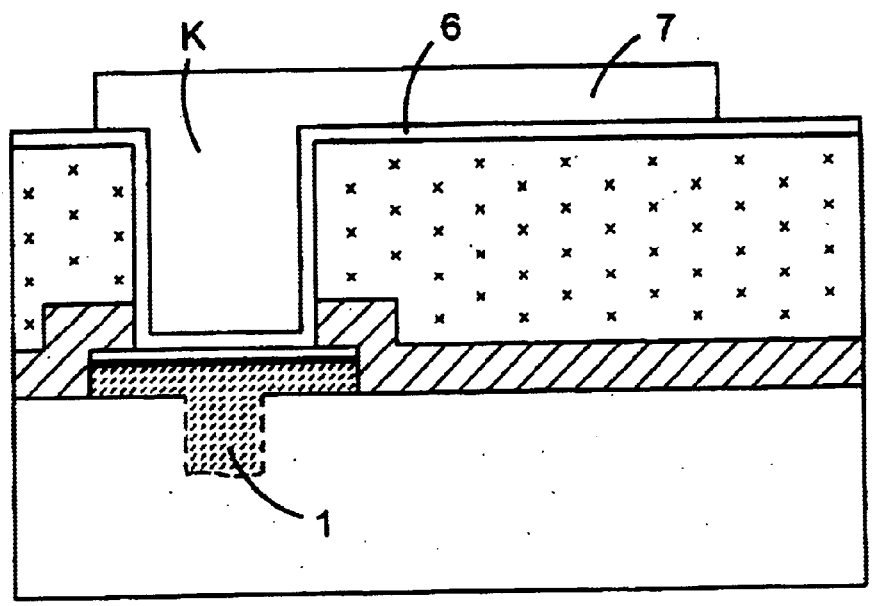

Thereafter, the photoresist layer PR1 is removed (see FIG. 4 hitherto).

A photoresist layer PR2 in which an area where a metal post 8 is to be formed on the wiring layer 7 is exposed is formed. The metal post 8 of made of Cu is formed in the exposed area to have a thickness of about 30–100 μm by electrolytic plating.

The first groove TC1 can be formed in various timings. For example, it can be formed after the metal post is formed. If the photoresist layer is formed to expose the line of the first groove TC1 can, the first groove TC can be formed by dicing along the exposed line. If the photoresist layer is separately formed to expose only the first groove TC1, the first groove TC1 can be also formed by etching (see FIG. 5 hitherto).

The photoresist layer PR2 is removed, and further the Cu thin film layer 6 is removed using the wring layer 7 as a mask (see FIG. 6 hitherto).

Further, in accordance with the invention, the upper portion of the interlayer insulating film 2 is etched isotropically by way of the first groove TC1 to form a second groove TC2 having a larger diameter than that of the first groove TC1. In this embodiment, hydrofluoric acid treatment is carried out using the fact that the BPSG film of the interlayer insulating film 2 has a higher isotropic etching rate than that of the silicon nitride film of the passivation film 3. Thus, the second groove TC2 having a larger opening diameter (e.g. about 20 μm) than that of the first groove TC1 is formed on the upper portion of the BPSG film (see FIG. 7 hitherto).

Although the step to be performed subsequently is not shown, the entire surface inclusive of the wiring layer 7 and metal post 8 may be covered with a $Si_3N_4$ film by plasma CVD.

The $Si_3N_4$ film is formed to obviate the deterioration of the interface due to the thermal reaction between the resin layer R before hardening to be formed later and Cu. To this end, the entire surface of the wiring layer 7 and metal post 8 must be covered with the $Si_3N_4$ film. Where the interface deterioration does not occur, this $Si_3N_4$ film is not required.

If the $Si_3N_4$ film is formed after the metal post 8 is formed (inclusive of the Ni 10 and Au 11 formed on the metal post 8 in a post step), the entire surface inclusive of the wiring layer 7 and the metal post 8 can be covered with the $Si_3N_4$ film. The side M exposed by patterning must be also protected. In this embodiment, the surface is covered after both layers 6 and 7 are patterned so that the side M can be protected.

The first groove TC1 may be formed after the $Si_3N_4$ film is formed.

Since the entire surface is covered with the $Si_3N_4$ film, in this state, the first groove TC1 can be diced or etched. For the same reason, oxidation of the metal post 8 can be prevented. The $Si_3N_4$ film can be also used as an etching protective film when the second groove TC2 is formed.

Further, after a resin layer R is applied on the entire surface, it is ground to expose the head of the metal post 8 (see FIG. 8 hitherto).

Subsequently, a Ni layer 10 having a thickness of about 100 nm is formed on the head of the metal post 8 by electrolytic plating and an Au layer 11 having a thickness of about 500 nm is formed on the Ni layer 10. A solder ball is loaded on the Au layer 11. The manufacturing process proceeds to a dicing step.

The dicing step is performed in such a manner that the approximate central portion of the first groove TC1 is fully cut using a dicing blade DC having a more narrow width than that of the first groove TC. The dicing blade DC cut a dicing region. Since the first groove TC1 is realized by half cutting to reach the semiconductor substrate, the interface ends of the respective layers formed above from the semiconductor substrate are protected by the resin layer R to complete the chip size package (see FIG. 9 hitherto).

In this case, the second groove TC2 having a larger opening diameter than that of the first groove TC1 is formed on the way of a full-cut line DL, and the insulating resin layer R is located there. This strengthens the contact between the resin layer and chip as compared with the conventional structure, thereby suppressing the exfoliation of the insulating resin layer R from the chip. Therefore, the reliability of the product in moisture proof can be enhanced.

Incidentally, after the semiconductor wafer is sealed with resin, its thickness may be reduced by grinding the rear surface. Where the semiconductor wafer is thin, the contact area between the resin and the semiconductor wafer is increased by the presence of the unevenness on the side wall is increased so that the contact therebetween can be improved.

In accordance with the invention, after the first groove is formed by half cutting, the second groove having a larger opening diameter than that of the first groove is formed on the upper portion of the interlayer insulating film using a difference in the etching rate between the interlayer insulating film and the passivation film. In this state, the semiconductor wafer is sealed with resin and fully cut. This strengthens the contact between the resin and chip on their side, thereby improving the reliability of the product such as the moisture-proof.

What is claimed is:

1. A method of manufacturing a semiconductor device comprising:
   forming a groove in a dicing region of a wafer, which is provided with an insulating layer thereover, and said groove formed to have substantially varying diameters, which become larger at a deeper end;
   providing a resin layer over said groove; and
   fully cutting the wafer through the groove being entirely covered with said resin layer.

2. A method of manufacturing a semiconductor device comprising:
   forming a groove in a dicing region of a wafer, which is provided with an insulating layer thereover, said groove having a first diameter at a shallower end of said groove and a second diameter larger than said first diameter at a deeper end of the said groove;
   providing a resin layer over said groove; and
   fully cutting the wafer through the groove being entirely covered with said resin layer.

3. A method of manufacturing a semiconductor device according to claim 2, wherein said first groove is formed by an isotropic etching and said second groove is formed by isotropic etching.

4. A method of manufacturing a semiconductor device comprising:
   forming a groove in a dicing region of a wafer, which is provided with an insulating layer thereover, said groove formed to have an uneven side surface;
   forming the insulating layer having an opening from which a portion of an electrode pad is exposed;
   forming a wiring layer in contact with said electrode pad exposed from said opening and extending to the upper surface of the wafer;
   locating said groove on the periphery of a chip inclusive of said wiring layer, said groove having a larger diameter at a deeper end than at a shallower end by isotropically etching the groove at its deeper end;
   resin-sealing the wafer surface inclusive of said wiring layer and the groove by resin layer; and
   fully cutting the wafer through the groove being entirely covered with said resin layer.

5. A method of manufacturing a semiconductor device according to claim 1, further comprising:
   forming on the wafer, a passivation film having an opening from which a portion of an electrode pad formed through the insulating layer is exposed;
   forming a wiring layer in contact with said electrode pad exposed from said opening and extending to the upper surface of the wafer;
   locating said groove on the periphery of a chip inclusive of said wiring layer,
   said groove having a larger diameter at a deeper end than at a shallower end by isotropically etching the groove at its deeper end; and
   resin-sealing the wafer surface inclusive of said wiring layer and said groove by the resin layer.

6. A method of manufacturing a semiconductor device according to claims 5, wherein said interlayer insulating film is made of an BPSG film, and said second groove having a larger opening diameter than that of said first groove is formed in the upper portion of said BPSG film using the fact that said BPSG film has a higher etching rate than that of a silicon nitride film of said passivation film.

7. A method of manufacturing a semiconductor device according to claim 1, wherein said wafer has a thickness of 200–300 $\mu$m.

8. A method of manufacturing a semiconductor device according to claim 1, wherein said first groove has a depth of about 1–100 $\mu$m from a surface of the wafer.

9. A method of manufacturing a semiconductor device according to claim 1, wherein said resin layer is made of thermosetting resin.

10. A method of manufacturing a semiconductor device according to claim 9, wherein said thermosetting resin is at least one selected from the group consisting of amic acid film, polimide and epoxy resin.

11. A method of manufacturing a semiconductor device according to claim 1, wherein said resin layer is made of thermoplastic resin.

12. A method of manufacturing a semiconductor device according to claim 11, wherein said thermoplastic resin is thermoplastic polymer.

13. A method of manufacturing a semiconductor device according to claim 1, wherein said cut in the wafer is narrower than the width of the groove.

14. A method of manufacturing a semiconductor device according to claim 1, wherein the groove is formed in the wafer up to a predetermined depth of the wafer.

15. A method of manufacturing a semiconductor device according to claim 1, wherein the groove is formed in the wafer up to about half the depth of the wafer.

* * * * *